United States Patent [19]
Doluca

[11] Patent Number: 5,565,715
[45] Date of Patent: Oct. 15, 1996

[54] METHOD AND APPARATUS FOR LOGIC SIGNAL LEVEL TRANSLATION TO A SEMICONDUCTOR SWITCH

[75] Inventor: Tunc Doluca, Saratoga, Calif.

[73] Assignee: Maxim Integrated Products, Sunnyvale, Calif.

[21] Appl. No.: 217,430

[22] Filed: Mar. 24, 1994

[51] Int. Cl.⁶ .................................................. H01H 83/10
[52] U.S. Cl. ........................ 307/130; 327/66; 327/108; 327/333; 327/540; 327/541; 327/543; 327/542
[58] Field of Search .............................. 307/130; 326/63, 326/68, 70, 71; 327/540, 541, 543, 333, 108, 66, 542

[56] References Cited

U.S. PATENT DOCUMENTS

| | | | |
|---|---|---|---|
| 4,792,704 | 12/1988 | Lobb et al. | 307/264 |
| 5,140,196 | 8/1992 | Shepherd | 326/63 |
| 5,276,366 | 1/1994 | Quigley et al. | 326/63 |
| 5,422,523 | 6/1995 | Roberts et al. | 326/68 |

*Primary Examiner*—William M. Shoop, Jr.
*Assistant Examiner*—Albert W. Paladini
*Attorney, Agent, or Firm*—Blakely, Sokoloff, Taylor & Zafman

[57] ABSTRACT

Method and apparatus for logic signal level translation to a semiconductor switch. The logic signal input is converted by a first circuit referenced to a first power supply level to a current source or sink gated on and off by the logic signal. The resulting current is coupled to the input of a second circuit referenced to a second power supply level to control complementary devices providing a switching signal for coupling to the semiconductor switch. The second circuit preferably includes circuitry for assuring that both complementary devices cannot be on at the same time.

28 Claims, 3 Drawing Sheets

METHOD AND APPARATUS FOR LOGIC SIGNAL LEVEL TRANSLATION TO A SEMICONDUCTOR SWITCH

BACKGROUND OF THE INVENTION

1. Field of the Invention

The present invention relates to the field of level translation circuits, and more specifically level translation circuits responsive to a logic signal to control a semiconductor switch operative at a substantially different voltage level.

2. Prior Art

In a variety of circuits, it is desirable to use a logic control signal to control a semiconductor switch operative at a substantially different voltage reference level. For example, in a motor driver application, the switch is located on the positive power terminal whereas the logic signals to control this switch are referenced to the negative power terminal.

Another example of this is in step-down topology DC to DC converters. FIG. 1 shows schematically the switch drive topology of a typical step-down DC-DC converter. For switching speed and low on resistance, it is highly preferred to use an n-channel MOSFET switch for the high side switch S1. The low side switch S2 could be a diode, or to reduce the on voltage drop across the element, could be more preferably an actively driven n-channel MOSFET. When an n-channel MOSFET is used for S1, note that to turn it on, a voltage higher than the input voltage VIN is required. On the other hand, this voltage cannot be too high or too low (negative) due to restrictions on the maximum gate to source potential of the MOSFET.

As shown schematically in FIG. 2, one scheme for driving the gate voltage that has been used in the past is to generate a voltage that is actually referred to the voltage of the source of n-channel MOSFET S1. The potential V(C1) (the voltage of node 2 minus the voltage of node 1 in FIG. 2) is developed across reservoir capacitor C1 by diode D1, charging C1 to V3 minus the forward conduction voltage drop of diode D1 every time node 1 is switched to ground.

The gate driver for MOSFET S1 turns the MOSFET on by connecting S1's gage to node 2, and turns S1 off by connecting S1's gate to node 1 (See FIG. 3 for waveforms). Note that in actuality, node 1 is at the potential VIN when S1 is on and at zero potential when S1 is off and switch S2 is on. Therefore, node 2 always flies up and down as S1 is turned on and off at a very high voltage slew rate. Furthermore, since the reservoir element is a capacitor, any current drain during the off state (both switches S1 and S2 non-conducting) will cause this circuit to be useless. This is because in modern DC—DC converters, there are long periods of zero load current resulting in no switching of S1 and S2. The reservoir capacitor C1 therefore cannot be discharged in switch S1's off state for the circuit to remain operative on command.

If switch S2 is going to be an active n-channel MOSFET, then there is one other requirement. The turn on and turn off times of S1 and S2 must be very well controlled to prevent them from being on at the same time, even if momentarily.

Prior art solutions to these problems have been complicated, and in general not monolithic solutions. Some applications use pulse transformers, some use capacitive coupling techniques, etc. But none of these really result in a solution that can be integrated on one chip for reduced cost and improved reliability.

The problem addressed by the present invention may be summarized as one of performing level translation of a logic signal located at one reference level (zero volts in FIG. 2) to a logic signal at another level (node 1 in FIG. 2). Furthermore, the solution should be monolithic, should provide the level translation at high speed and also work reliably even if the controlled switch voltage is rapidly changing. There should also be no power consumption when the power switch is off. Finally, in applications where there are two active switches, the two switches must never be on at the same time, even if only momentarily.

BRIEF SUMMARY OF THE INVENTION

Method and apparatus for logic signal level translation to a semiconductor switch are disclosed. The logic signal input is converted by a first circuit referenced to a first power supply level to a current source or sink gated on and off by the logic signal. The resulting current is coupled to the input of a second circuit referenced to a second power supply level to control complementary devices providing a switching signal for coupling to the semiconductor switch. The second circuit preferably includes circuitry for assuring that both complementary devices cannot be on at the same time.

DETAILED DESCRIPTION OF THE INVENTION

Figure 4:
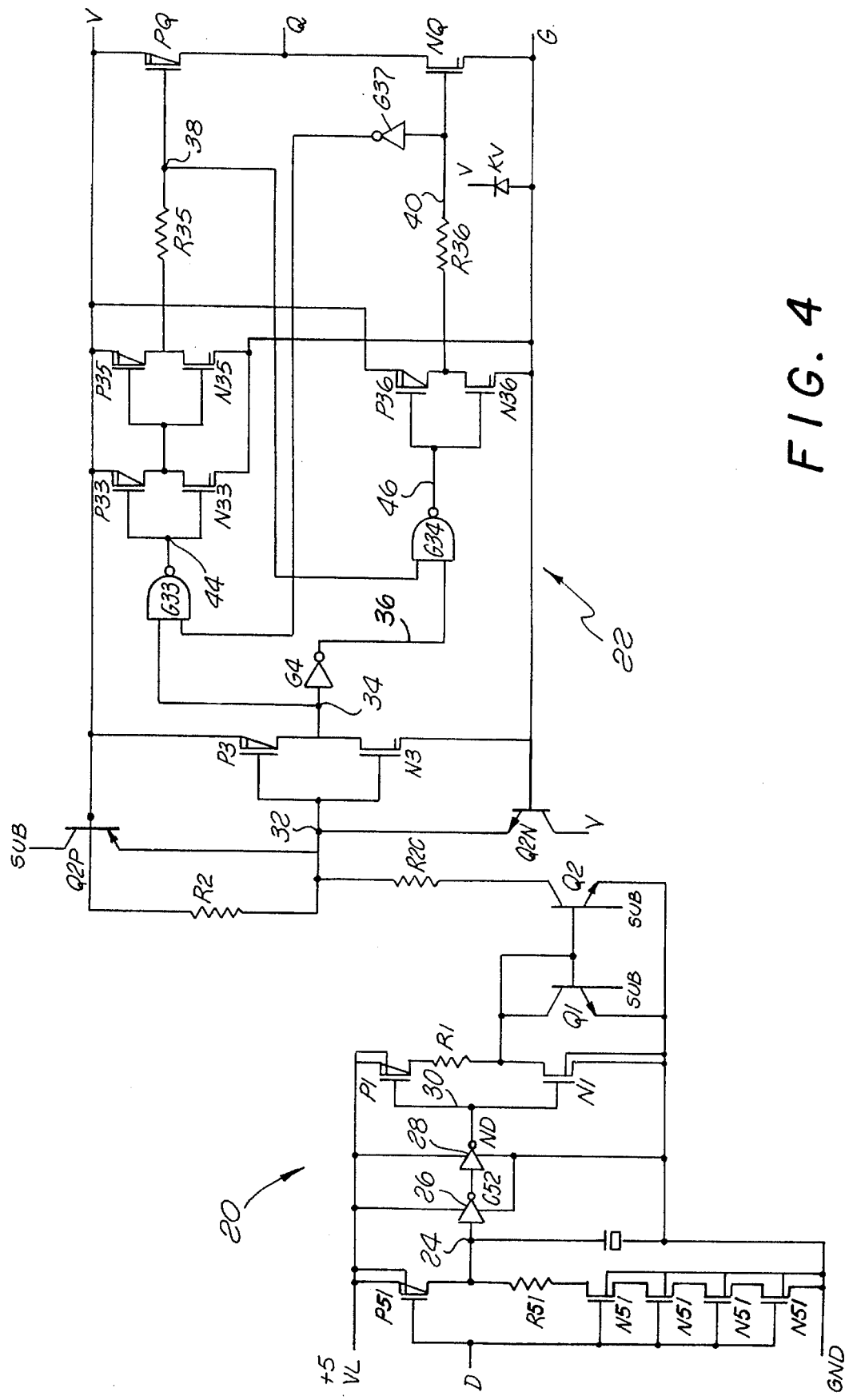
FIG. 4 is a circuit diagram for the voltage translator of the preferred embodiment of the present invention.

First referring to FIG. 4, a circuit diagram for the preferred embodiment of the present invention translator may be seen. The translator consists of two sections: a timing control and signal generator section 20 and a flying switch driver section 22. The two sections are coupled using current to convey the control signal from the timing control and signal generator section to the flying switch driver section. In the description to follow, and as illustrated in the drawings, n-channel transistors shall be identified by an appropriate numerical designation preceded by an "N", and p-channel transistors shall be identified by an appropriate numerical designation preceded by a "P".

Figure 1:
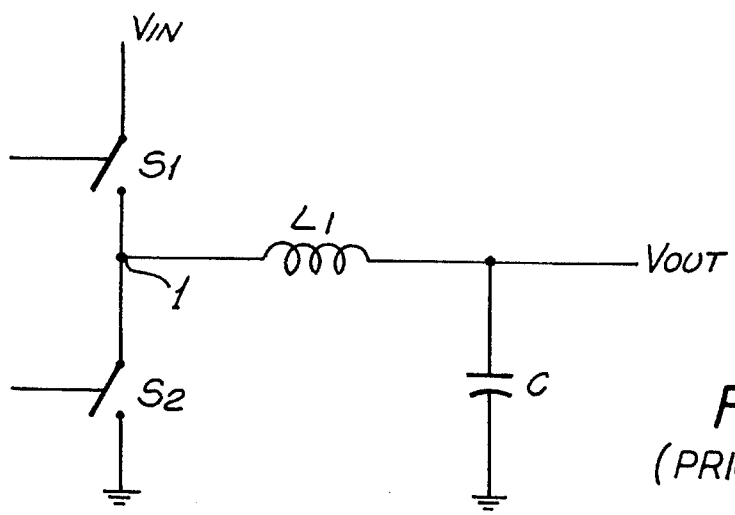
FIG. 1 presents a schematic diagram of the switch drive topology of a typical step-down DC—DC converter.
Figure 2:
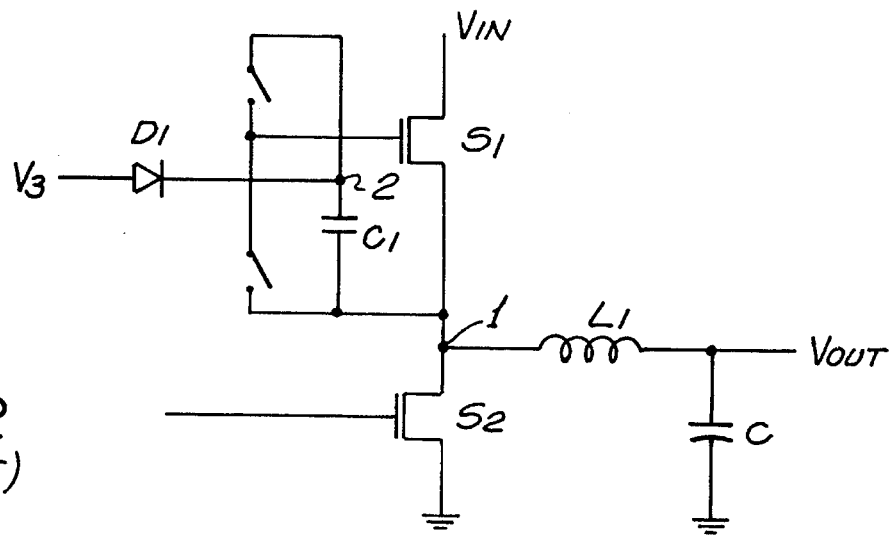
FIG. 2 illustrates one scheme for driving the gate voltage of n-channel MOSFET S1 of FIG. 1 that has been used in the past to generate a voltage that is actually referred to the voltage of the source of n-channel MOSFET S1.
Figure 3:
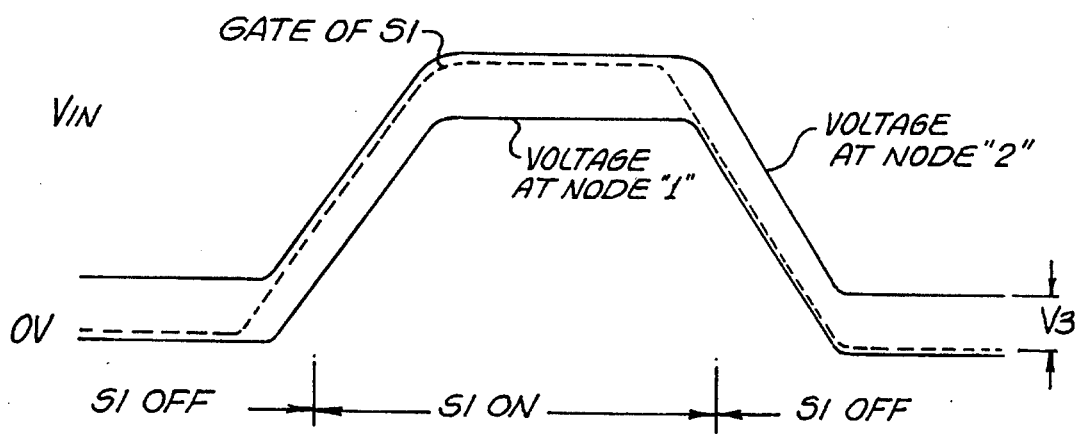
FIG. 3 presents wave forms for the voltages for node 1, node 2 and the gate of MOSFET switch S1 for the turn on and turn off of the MOSFET switch.
Figures 5, 6:
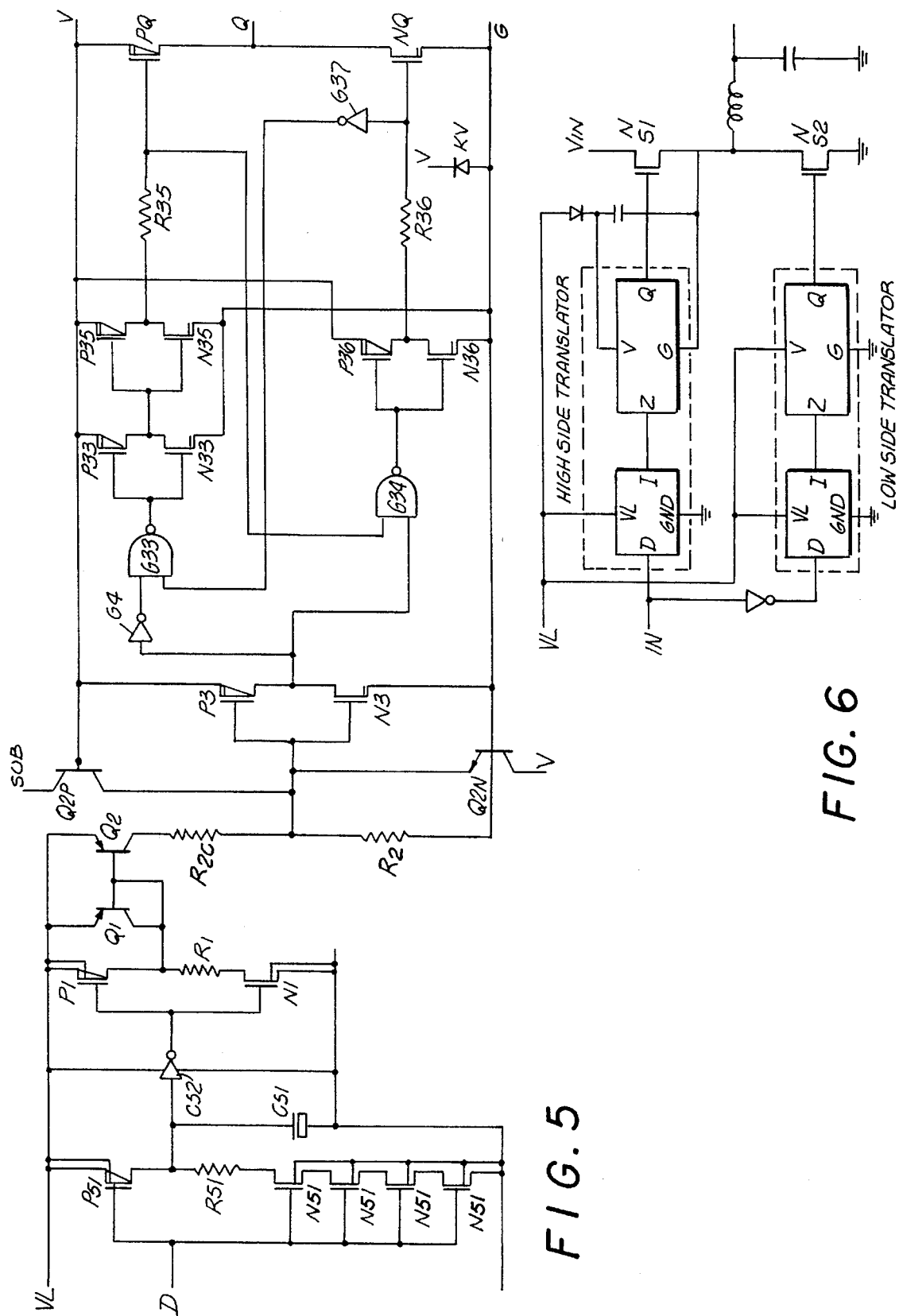
FIG. 5 is a circuit diagram for a voltage translator similar to that of FIG. 4, but altered for voltage level shifting downward, rather than upward as in FIG. 4.
FIG. 6 is a block diagram for a voltage translator for use in a DC-to-DC converter of the type shown in FIG. 2, the translator guaranteeing that both S1 and S2 are never on simultaneously by using two substantially identical level translators.

In the exemplary circuit shown, VL (+5 V) is higher than ground (GND). Similarly, the voltage differential (V–G) is also +5 V and G is a positive potential. Referring to FIGS. 2, 4 and 6 node V of FIGS. 4 and 6 is equivalent to node 2 of FIG. 2 and node G of FIGS. 4 and 6 is equivalent to node 1 of FIG. 2 shown in that Figure.

Input D is the logic control signal for the circuit (referenced to the voltages VL and ground GND), and the output Q is the output drive signal (referenced to the voltages V and G) for controlling a switch equivalent to MOSFET switch S1 of FIG. 2 (see also FIG. 6). When the input D is low, transistors N51 will be off and transistor P51 will be on, pulling node 24 high and charging capacitor C51. Then when the input D goes high, transistor P51 will turn off and transistors N51 will turn on. Transistors N51 together with resistor R51 and capacitor C51 provide a controlled fall rate in the voltage of node 24, with serially connected inverters 26 and 28 providing a voltage on node 30 which is a squared-up version of the voltage on node 24, but with a controlled delay when the input D goes high because of the combination of transistors N51, resistor R51 and capacitor C51.

Transistors P1 and N1 are connected as an inverter. Transistors Q1 and Q2 are Connected as a current mirror, transistor Q1 clamping the base to emitter voltage of transistor Q2 equal to the base to emitter voltage of transistor Q1 appropriate to conduct the current provided thereto through resistor R1. Thus, transistor Q2 will conduct the same amount of current as is provided to transistor Q1 (ratioed by the transistor areas (channel widths) which in the preferred embodiment are equal). Following the predetermined delay after input D goes high, node 30 will be pulled low by the inverters 26 and 28, turning on transistor P1 and turning off transistor N1. This provides a current through resistor R1 and transistor Q1, which current will be mirrored to transistor Q2. The current through transistor Q1 and thus transistor Q2 will now be equal to (VL−0.6)/R1.

When input D goes low, transistors N51 turn off and transistor P51 turns on. This rapidly pulls node 24 high and thus node 30 high, turning off transistor P1 and turning on transistor N1 to pull the base of transistor Q2 low and thus turn off the same. Thus, the function of the timing control and signal generator section 20 is to bias transistor Q2 to act as a current sink for the flying switch driver section 22 following a controlled delay after the input signal D goes high, and to turn off the current sink with a minimal turn-off delay after the input D goes low.

Now referring to the flying switch driver section 22 of FIG. 4, transistors P3 and N3 are connected as an inverter. By choosing the correct resistor ratios for resistors R2 and R1 and controlling the voltage VL and the voltage differential V−G, sufficient voltage variations across R2 will be developed to cause the inverter consisting of transistors P3 and N3 to change state responsive to whether the current sink provided by transistor Q2 is on or off. Thus, when the input D is high, transistor Q2 will be on to conduct sufficient current to effectively pull node 32 low, which in turn pulls node 34 high and node 36 low. When the input D is low, transistor Q2 will be off, and resistor R2 will pull node 32 high, which in turn pulls node 34 low and node 36 high.

Transistors PQ and NQ determine the state of the output Q of the circuit. When PQ is turned on, specifically when node 38 is low, the output Q will be at V volts, whereas when node 40 is high, transistor NQ will be on and the output Q will be at G volts. It is important, however, that transistors PQ and NQ not be on simultaneously, even for a very short duration, because of the power loss, heating and even potential damage to these or other devices providing the voltages V and G. This protection is provided by the circuitry coupling the voltages on nodes 34 and 36 to nodes 38 and 40.

Transistors P33 and N33 are connected as an inverter, as are transistors P35 and N35. Accordingly, because the two inverters are connected in series, the voltage on node 38 will be the same as the voltage on node 32, though with node 38 having rise and fall times controlled by resistor R35 to prevent excessive voltage bounce due to lead inductance. Also, transistors P36 and N36 are connected as an inverter.

Assume for the moment that transistor NQ is on. This means that node 40 is high, and thus the output of inverter G37 forming one input to NAND gate G33 is low. Since the output of a NAND gate is high when either (or any) input thereto is low, the output of the NAND gate on node 44 is necessarily high, independent of the voltage on node 34. Thus, when transistor NQ is on, inverter G37 and NAND gate G33 effectively decouple the state of node 34 from the output of the NAND gate on node 44, so that so long as transistor NQ stays on, the output of NAND gate 44 necessarily stays high. Therefore node 38 also remains high, and thus transistor PQ remains off, again independent of the state of the voltage on line 34. Similarly, if transistor PQ is on, this means that node 38 is low, which in turn forces node 46 to remain high independent of the state of the voltage on line 36. The high state on line 46 is converted to a low state on line 40 by the inverter consisting of transistors P36 and N36. Consequently, it may be seen that independent of the transient or steady state of the voltages on lines 34 and 36, neither transistor PQ nor transistor NQ may turn on until the other transistor has turned off. Thus, the protection against the simultaneous on condition is obtained.

As stated before, following a predetermined delay after the input D goes high, the current sink comprised of transistor Q2 turns on, effectively pulling node 32 low (relative to the V,G power supply), which pulls node 34 high and node 36 low. With one input to NAND gate G34 low, the output thereof is necessarily high, which high state is inverted by the following inverter to turn off transistor NQ. When transistor NQ is off, both inputs to NAND gate G33 will be high, driving node 44 low and node 38 low to turn on transistor PQ, pulling the output Q high a predetermined length of time after the input D goes high.

When the input D goes low, the current sink comprised of transistor Q2 will quickly turn off, whereupon resistor R2 will pull node 32 high, with the following inverter pulling node 34 low and inverter G4 pulling node 36 high. The first effect of node 34 going low is to make one of the inputs to NAND gate G33 low, driving the output of the NAND gate on node 44 high, and thus line 38 high to turn off transistor PQ. With transistor PQ off because of line 38 being high, now both inputs to NAND gate G34 are high, driving the output thereof on line 46 low and line 40 high, turning on transistor NQ to pull the output Q of the circuit low.

Transistor Q2P has its emitter connected to node 32, its base connected to the voltage V and its collector connected to the substrate. As such, the transistor Q2P will turn on whenever the voltage on node 32 reaches the voltage V plus one forward conduction diode voltage drop, thereby limiting the positive voltage swing of node 32 to prevent inadvertent damage to the gate insulator of transistors P3 and N3. Similarly, transistor Q2N has its emitter connected to node 32, its base connected to voltage G, and its collector connected to the voltage V. Consequently, transistor Q2N will turn on whenever the voltage of node 32 falls below the voltage G by more than one forward conduction diode voltage drop, thereby limiting the possible low side voltage excursion of node 32 to a safe level for transistors P3 and N3.

When used in an application like a DC-to-DC converter as shown in FIG. 2, it dan be guaranteed that both S1 and S2 are never on simultaneously by using two such level translators that are substantially the same. This is shown in FIG. 6. The low side translator has the "V" and "G" nodes of the flying control section actually tied to "VL" and "GND" nodes. So, in effect, there is no level translation accomplished. However, the turn-on delay established by C51, N51 and R51 and the rest of the logic gates will be matched to the delays established in the high side level translator. Similarly, the turn-off delay will also be substantially matched. The delays in the high side translator and the low side translator are substantially matched and track with outside effects like temperature, supply voltage and process variations.

Thus here has been described herein a circuit that accomplishes the following:

1. A logic signal (D) at one level (VL, GND in the exemplary case) has been used to generate a drive signal (Q) at another level (V,G).

2. The delay in the signal path is minimized. In this case the delay is essentially determined by the parasitic capacitance at node 2 and the current drive into the base of Q1 as set by R1.

3. The power consumption of the circuit in the off state (i.e., when D=LOW) is zero, since no current flows through R1 and R2 and the rest of the circuit is CMOS with no quiescent current flow.

4. The circuit is rugged against high rates of change of the potential at G referenced to GND. When the capacitance at node 2 is minimized, high speed changes in node V's voltage will not change the potential of node 2 referenced to node V.

5. The turn-on delay is well controlled through the use of N51/R51 and C51. A very practical circuit that minimizes the risk of having both S1 and S2 on at the same time can be accomplished by actually using substantially the same driver circuit to drive both switch S1 and S2.

Note that the polarity of the circuit can be inverted where V and G are always lower than ground potential. This can be done by changing transistors Q1 and Q2 to PNP transistors, connecting them to the VL supply so as to form a mirrored current source rather than a sink, connecting one end of resistor R2C to the voltage G, connecting the current source to resistor R2C, changing the position of resistor R1 relative to node 50, eliminating one of inverters 26 and 28, and changing the position of gate G4 so that line 34 provides one input to NAND gate G34 and the signal on line 34 is inverted to form the corresponding input to NAND gate G33. A representative circuit with these changes made therein may be seen in FIG. 5. Also, if desired, Q1 and Q2 could be MOSFET devices or any other device where current flow in one device controls current flow in the other device in a predictable way.

The preferred embodiment of the invention is intended for use in buck or step-down type DC—DC converters. Other applications in which the invention may be used include other switch-mode power supplies, motor drivers, H-bridge drivers, etc. Thus, while the present invention has been disclosed and described with respect to a certain preferred embodiments thereof, it will be understood to those skilled in the art that the present invention may be varied without departing from the spirit and scope of the invention.

I claim:

1. A voltage level translation circuit for translating a switching signal input of a first voltage range to a semiconductor switch switching signal output of a second voltage range comprising:

a first circuit operative from a power source referenced to the first voltage range for responding to the switching signal input to generate a predetermined current when the switching signal input is in a first switching state, the first circuit including a current mirror to mirror the predetermined current; and a second circuit operative from a power source referenced to the second voltage range and having its input coupled to the current mirror of the first circuit so as to be responsive thereto, the second circuit providing the semiconductor switch switching signal output ranging between the upper and lower voltages of the second voltage range as controlled by the switching signal input.

2. The voltage level translation circuit of claim 1 wherein the first circuit is responsive to the switching signal input to provide substantially no current when the switching signal input is in a second switching state.

3. The voltage level translation circuit of claim 1 wherein the semiconductor switch switching signal output is provided from the connection between complementary semiconductor devices coupled in series between the upper and lower voltages of the second voltage range, and further comprising circuitry to assure that both complementary semiconductor devices are not on at the same time.

4. The voltage level translation circuit of claim 1 wherein the current mirror is a current source.

5. The voltage level translation circuit of claim 1 wherein the current mirror is a current sink.

6. The voltage level translation circuit of claim 1 wherein at least one voltage of the second voltage range exceeds the highest voltage of the first voltage range.

7. The voltage level translation circuit of claim 1 wherein at least one voltage of the second voltage range is less than the lowest voltage of the first voltage range.

8. The voltage level translation circuit of claim 1 wherein the first circuit includes circuitry to provide a controlled delay between the switching signal input and the semiconductor switch switching signal output when the switching signal input changes from one of the switching signal input states to the other switching signal input state.

9. A voltage level translation circuit for translating a switching signal input of a first voltage range to a semiconductor switch switching signal output of a second voltage range comprising:

an integrated circuit having:

a first circuit operative from a power source referenced to the first voltage range for responding to the switching signal input to generate a predetermined current when the switching signal input is in a first switching state, the first circuit including a current mirror to mirror the predetermined current; and a second circuit operative from a power source referenced to the second voltage range and having its input coupled to the current mirror of the first circuit so as to be responsive thereto, the second circuit providing the semiconductor switch switching signal output ranging between the upper and lower voltages of the second voltage range as controlled by the switching signal input.

10. The integrated voltage level translation circuit of claim 9 wherein the first circuit is responsive to the switching signal input to provide substantially no current when the switching signal input is in a second switching state.

11. The voltage level translation integrated circuit of claim 10 wherein the semiconductor switch switching signal output is provided from the connection between complementary semiconductor devices coupled in series between the upper and lower voltages of the second voltage range, and further comprising circuitry to assure that both complementary semiconductor devices are not on at the same time.

12. The voltage level translation integrated circuit of claim 9 wherein the current mirror is a current source.

13. The voltage level translation integrated circuit of claim 9 wherein the current mirror is a current sink.

14. The voltage level translation integrated circuit of claim 9 wherein at least one voltage of the second voltage range exceeds the highest voltage of the first voltage range.

15. The voltage level translation integrated circuit of claim 9 wherein at least one voltage of the second voltage range is less than the lowest voltage of the first voltage range.

16. The voltage level translation integrated circuit of claim 9 wherein the first circuit includes circuitry to provide a controlled delay between the switching signal input and the semiconductor switch switching signal output when the switching signal input changes from one of the switching signal input states to the other switching signal input state.

17. A method of providing voltage level translation for translating a switching signal input of a first voltage range to a semiconductor switch switching signal output of a second voltage range comprising the steps of:

(a) providing a first circuit operative from a power source referenced to the first voltage range for responding to the switching signal input to generate a first predetermined current when the switching signal input is in a first switching state, the first circuit including a current mirror to mirror the first predetermined current; and, (b) coupling the first predetermined current to the input of a second circuit operative from a power source referenced to the second voltage range, the second circuit being responsive to the mirrored current to provide the semiconductor switch switching signal output ranging between the upper and lower voltages of the second voltage range as controlled by the switching signal input, wherein the first and second circuits being in a single integrated circuit form.

18. The method of claim 17 wherein the first circuit is responsive to the switching signal input to generate a second predetermined current when the switching signal input is in a second switching state.

19. The method of claim 18 wherein the second predetermined current is substantially zero.

20. The method of claim 17 wherein the semiconductor switch switching signal output is provided from the connection between complementary semiconductor devices coupled in series between the upper and lower voltages of the second voltage range, and further comprising the step of assuring that both complementary semiconductor devices are not on at the same time.

21. A voltage level translation circuit for translating a switching signal input of a first voltage range to a semiconductor switch switching signal output of a second voltage range comprising:

a first circuit operative from a power source referenced to the first voltage range for responding to the switching signal input to generate a predetermined current when the switching signal input is in a first switching state and to provide substantially no current when the switching signal input is in a second switching state, the first circuit including a current mirror to mirror the predetermined current; and a second circuit operative from a power source referenced to the second voltage range and having its input coupled to the current mirror of the first circuit so as to be responsive thereto, the second circuit providing the semiconductor switch switching signal output ranging between the upper and lower voltages of the second voltage range as controlled by the switching signal input.

22. The voltage level translation circuit of claim 21 wherein the current mirror operates as a current source.

23. The voltage level translation circuit of claim 21 wherein the current mirror operates as a current sink.

24. The voltage level translation circuit of claim 21 wherein the first circuit includes circuitry to provide a controlled delay between the switching signal input and the semiconductor switch switching signal output when the switching signal input changes from one of the switching signal input states to the other switching signal input state.

25. A voltage level translation circuit for translating a switching signal input of a first voltage range to a semiconductor switch switching signal output of a second voltage range comprising:

an integrated circuit including a first circuit operative from a power source referenced to the first voltage range for responding to the switching signal input to generate a first predetermined current when the switching signal input is in a first switching state and to provide a second predetermined current when the switching signal input is in a second switching state, the first current includes a current mirrors to mirror the first predetermined circuit, and a second circuit operative from a power source referenced to the second voltage range, the second circuit providing the semiconductor switch switching signal output ranging between the upper and lower voltages of the second voltage range as controlled by the switching signal input.

26. The voltage in claim 25, wherein the second predetermined current is substantially zero.

27. The voltage level translation integrated circuit of claim 25 wherein the current mirror operates as a current source or alternatively as a current sink.

28. A method of providing voltage level translation for translating a switching signal input of a first voltage range to a semiconductor switch switching signal output of a second voltage range comprising the steps of:

(a) providing a first circuit operative from a power source referenced to the first voltage range for responding to the switching signal input to generate a first predetermined current when the switching signal input is in a first switching state, the first circuit including a current mirror to mirror the first predetermined current;

(b) coupling the first predetermined current to the input of a second circuit operative from a power source referenced to the second voltage range, the second circuit being responsive to the mirrored current to provide the semiconductor switch switching signal output ranging between the upper and lower voltages of the second voltage range as controlled by the switching signal input, wherein the first and second circuits being in a single integrated circuit form; and (c) providing circuitry, coupled to the second circuit, to ensure that at least two complementary semiconductor devices coupled to said circuitry are not on at the same time.

* * * * *